United States Patent
Sugimura et al.

(10) Patent No.: US 11,885,038 B2
(45) Date of Patent: Jan. 30, 2024

(54) METHOD OF ESTIMATING CONVECTION PATTERN OF SILICON MELT, METHOD OF ESTIMATING OXYGEN CONCENTRATION OF SILICON SINGLE CRYSTAL, METHOD OF MANUFACTURING SILICON SINGLE CRYSTAL, AND RAISING DEVICE OF SILICON SINGLE CRYSTAL

(71) Applicant: SUMCO CORPORATION, Tokyo (JP)

(72) Inventors: Wataru Sugimura, Tokyo (JP);
Ryusuke Yokoyama, Tokyo (JP);
Toshiyuki Fujiwara, Tokyo (JP);
Toshiaki Ono, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 334 days.

(21) Appl. No.: 16/975,563

(22) PCT Filed: Feb. 27, 2019

(86) PCT No.: PCT/JP2019/007442
§ 371 (c)(1),
(2) Date: Aug. 25, 2020

(87) PCT Pub. No.: WO2019/167987
PCT Pub. Date: Sep. 6, 2019

(65) Prior Publication Data
US 2020/0399780 A1    Dec. 24, 2020

(30) Foreign Application Priority Data

Feb. 28, 2018  (JP) .................................. 2018-035830

(51) Int. Cl.
*C30B 15/26*  (2006.01)
*C30B 15/16*  (2006.01)
(Continued)

(52) U.S. Cl.
CPC .............. *C30B 15/26* (2013.01); *C30B 15/16* (2013.01); *C30B 29/06* (2013.01); *C30B 30/04* (2013.01)

(58) Field of Classification Search
CPC ......... C30B 15/14; C30B 15/16; C30B 15/20; C30B 15/26; C30B 15/305; C30B 29/06; C30B 30/04
See application file for complete search history.

(56) References Cited

U.S. PATENT DOCUMENTS

| 6,423,285 B1 * | 7/2002 | Itoi ......................... C30B 30/04 117/917 |
| 11,186,921 B2 * | 11/2021 | Yokoyama .............. C30B 29/06 |

(Continued)

FOREIGN PATENT DOCUMENTS

| CN | 104278321 A | 1/2015 |
| JP | 6-129911 | 5/1994 |

(Continued)

OTHER PUBLICATIONS

European Patent Office, English computer translation of JP 2009-161400 (Year: 2022).*

(Continued)

*Primary Examiner* — Matthew J Song
(74) *Attorney, Agent, or Firm* — GREENBLUM & BERNSTEIN, P.L.C.

(57) ABSTRACT

A convection pattern estimation method of a silicon melt includes: applying a horizontal magnetic field of 0.2 tesla or more to a silicon melt in a rotating quartz crucible with use of a pair of magnetic bodies disposed across the quartz crucible; before a seed crystal is dipped into the silicon melt to which the horizontal magnetic field is applied; measuring temperatures at a first and second measurement points positioned on a first imaginary line that passes through a center of a surface of the silicon melt and is not in parallel (Continued)

with a central magnetic field line of the horizontal magnetic field as viewed vertically from above; and estimating a direction of a convection flow in a plane in the silicon melt orthogonal to the direction in which the horizontal magnetic field is applied on a basis of the measured temperatures of the first and second measurement points.

6 Claims, 10 Drawing Sheets

(51) Int. Cl.
*C30B 29/06* (2006.01)
*C30B 30/04* (2006.01)

(56) References Cited

U.S. PATENT DOCUMENTS

| | | | |
|---|---|---|---|
| 11,261,540 B2 * | 3/2022 | Matsushima | C30B 30/04 |
| 11,441,238 B2 * | 9/2022 | Yokoyama | C30B 15/14 |
| 11,473,211 B2 * | 10/2022 | Matsukuma | C30B 15/22 |
| 11,781,242 B2 * | 10/2023 | Sakamoto | C30B 15/206 |
| | | | 117/15 |
| 2007/0062442 A1 | 3/2007 | Cho | |
| 2008/0047485 A1 | 2/2008 | Cho | |

FOREIGN PATENT DOCUMENTS

| | | | | |
|---|---|---|---|---|
| JP | 9-263486 | | 10/1997 | |
| JP | H9-263485 A | | 10/1997 | |
| JP | 09315887 A | * 12/1997 | | C30B 27/02 |
| JP | 2007-84417 | | 4/2007 | |
| JP | 2009-161400 A | | 7/2009 | |
| JP | 2009161400 A | * 7/2009 | | C30B 15/22 |
| JP | 2012-148938 | | 8/2012 | |
| JP | 2016-98147 | | 5/2016 | |
| JP | 2016098147 A | * 5/2016 | | C30B 15/20 |
| JP | 2017210387 A | * 11/2017 | | C30B 15/20 |
| KR | 20080061609 A | * 7/2008 | | H01L 21/20 |
| KR | 10-2017-0079371 A | | 7/2017 | |
| WO | WO 2017/077701 A1 | | 5/2017 | |

OTHER PUBLICATIONS

Korean Intellectual Property Office, English computer translation of KR 10-2008-0061609 (Year: 2022).*
European Patent Office, English computer translation of JP2016098147 (Year: 2022).*
European Patent Office, English computer translation of JP 09-315887 (Year: 2022).*
Office Action for JP App. No. 2018-035830, dated Mar. 16, 2021 (w/ translation).
Office Action for CN App. No. 201980015951.7, dated Aug. 10, 2021 (w/ translation).
IPRP for PCT/JP2019/007442, dated Sep. 1, 2020.
Official Communication issued in International Bureau of WIPO Patent Application No. PCT/JP2019/007442, dated May 7, 2019.
Office Action for KR App. No. 10-2020-7024679, dated Oct. 29, 2021 (w/ translation).

* cited by examiner

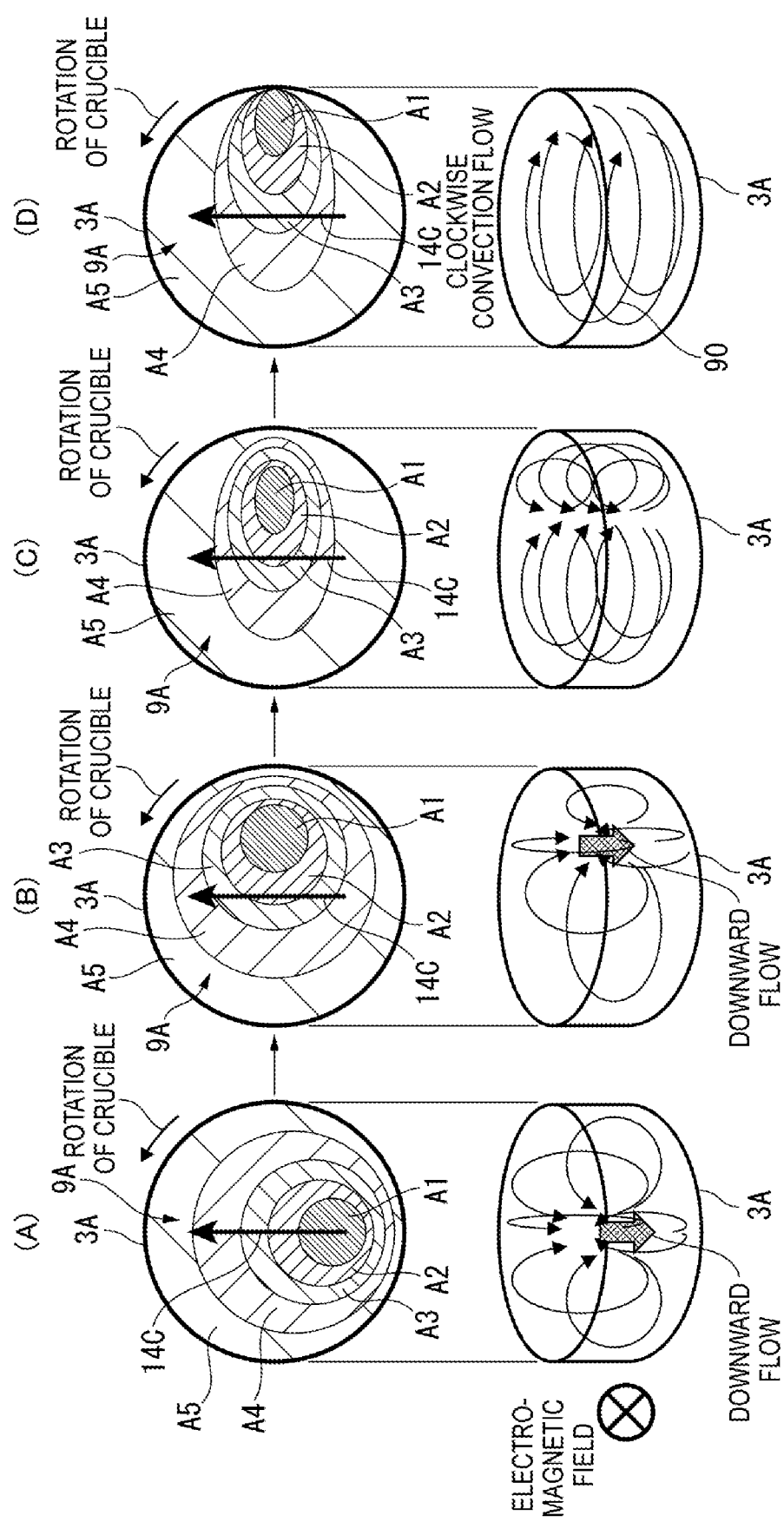

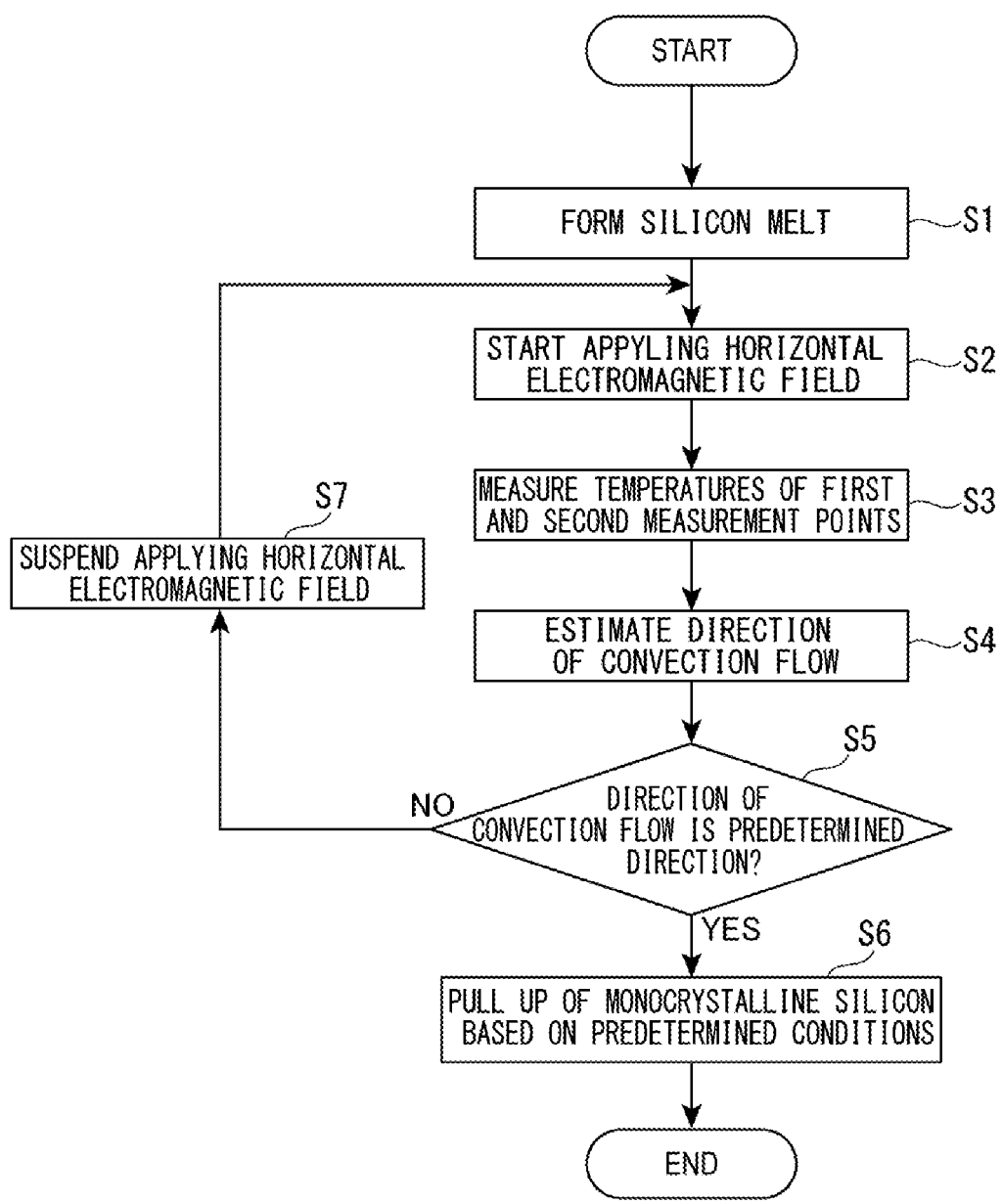

METHOD OF ESTIMATING CONVECTION PATTERN OF SILICON MELT, METHOD OF ESTIMATING OXYGEN CONCENTRATION OF SILICON SINGLE CRYSTAL, METHOD OF MANUFACTURING SILICON SINGLE CRYSTAL, AND RAISING DEVICE OF SILICON SINGLE CRYSTAL

TECHNICAL FIELD

The present invention relates to a convection pattern estimation method of a silicon melt, an oxygen concentration estimation method of monocrystalline silicon, a manufacturing method of monocrystalline silicon, and a pull-up device of monocrystalline silicon.

BACKGROUND ART

A method called Czochralski method (hereinafter, referred to as CZ method) is used for manufacturing monocrystalline silicon. In such a manufacturing method using the CZ method, a quality of the monocrystalline silicon is improved by accurately measuring a surface temperature of a silicon melt (see, for instance, Patent Literatures 1 to 3).

Patent Literature 1 discloses that monocrystalline silicon without occurrence of dislocation is manufactured by measuring a surface temperature of a silicon melt with a high accuracy before seed crystal is dipped into the silicon melt.

Patent Literature 2 discloses that a stray-light eliminating plate, which eliminates radiation light (stray light) from a wall of a crucible and a heater during growth of monocrystalline silicon, is provided to allow highly accurate measurement of a surface temperature of a silicon melt without being affected by the stray light.

Patent Literature 3 discloses that highly accurate measurement of a surface temperature of a silicon melt can be achieved without being affected by the stray light during growth of monocrystalline silicon by providing a radiation thermometer that measures a temperature based on a radiation light of a silicon melt and the stray light reflected on a surface of the silicon melt and a two-color radiation thermometer that measures a temperature based on the stray light.

CITATION LIST

Patent Literature(s)

Patent Literature 1 JP 2012-148938 A
Patent Literature 2 JP 9-263486 A
Patent Literature 3 JP 6-129911 A

SUMMARY OF THE INVENTION

Problem(s) to be Solved by the Invention

The MCZ (Magnetic field application CZochralski) method of applying a horizontal magnetic field to a silicon melt has been known as a manufacturing method of monocrystalline silicon.

It is conceivable to apply the methods as disclosed in Patent Literatures 1 to 3 in the MCZ method to improve a quality of monocrystalline silicon. However, another problem occurs that a desired oxygen concentration is sometimes not obtained.

An object of the invention is to provide a convection pattern estimation method of a silicon melt for appropriately estimating an oxygen concentration of monocrystalline silicon before the monocrystalline silicon is pulled up, an oxygen concentration estimation method of monocrystalline silicon, a manufacturing method of monocrystalline silicon, and a pull-up device of monocrystalline silicon.

Means for Solving the Problem(s)

According to an aspect of the invention, a convection pattern estimation method of a silicon melt used for manufacturing monocrystalline silicon includes: applying a horizontal magnetic field having an intensity of 0.2 tesla or more to the silicon melt in a rotating quartz crucible; before a seed crystal is dipped into the silicon melt applied with the horizontal magnetic field, measuring temperatures at a first measurement point and a second measurement point both positioned on a first imaginary line that passes through a center of a surface of the silicon melt and is not in parallel with a central magnetic field line on the horizontal magnetic field as viewed vertically from above; and estimating a direction of a convection flow in the silicon melt in a plane orthogonal to a direction in which the horizontal magnetic field is applied, on a basis of the measured temperatures at the first measurement point and the second measurement point.

When the horizontal magnetic field is not applied to the silicon melt, a downward flow, which once rises from an outer part of the silicon melt and then flows downward at a central part of the silicon melt, is generated in the silicon melt. When the quartz crucible is rotated in this state, the downward flow is shifted to a position offset from the rotation center and rotates in a rotation direction of the quartz crucible as viewed from above the quartz crucible. When the horizontal magnetic field whose intensity is 0.01 tesla or more is applied in this state, the rotation of the downward flow as viewed from above is restrained. Subsequently, when a magnetic field intensity is increased, a magnitude of the convection flow in a rising direction changes on the right side and the left side of the downward flow in a plane (a plane orthogonal to the direction in which the horizontal magnetic field is applied (hereinafter, referred to as a "field-orthogonal cross-section")) in the silicon melt as viewed in a negative direction of a Y axis (in a right-handed XYZ Cartesian coordinate system that defines a center of the silicon melt as an origin, an upward direction as a positive direction of a Z axis, and a direction to which the horizontal magnetic field is applied as a positive direction of the Y axis). When the magnetic field intensity reaches 0.2 tesla, on any side with respect to the application direction in the silicon melt, one of the convection flows disappears and only a clockwise or anticlockwise convection flow remains. When the convection flow is fixed clockwise in the field-orthogonal cross-section, the temperature of the silicon melt becomes higher on the left side than on the right side. When the convection flow is fixed anticlockwise, the temperature of the silicon melt becomes higher on the right side than on the left side.

Since the pull-up device of monocrystalline silicon, which is symmetrically designed, is not strictly symmetric with regard to the components thereof, a thermal environment in the chamber is also not symmetric.

For instance, when the convection flow is fixed clockwise in a pull-up device having such a thermal environment that the quartz crucible has a higher temperature on the left side than on the right side in the field-orthogonal cross-section, since the left side of the silicon melt in the clockwise convection flow becomes higher in temperature, the temperature on the left side of the silicon melt becomes higher in synergy with the thermal environment. In contrast, when the convection flow is fixed anticlockwise, the synergistic effect with the thermal environment as in the clockwise convection flow does not occur and the left side of the silicon melt does not become so high in temperature.

Since an amount of oxygen eluted from the quartz crucible is increased as the temperature of the silicon melt becomes higher, when the pull-up device having the above-described thermal environment is used for pulling up the monocrystalline silicon, the amount of oxygen caught in the monocrystalline silicon when the convection flow is fixed clockwise is increased to raise the oxygen concentration in the straight body with respect to the convection flow that is fixed anticlockwise.

According to the above aspect of the invention, the temperatures at the first measurement point and the second measurement point positioned on the first imaginary line that passes through the center of the surface of the silicon melt viewed vertically from above and is not in parallel with the central magnetic field line of the horizontal magnetic field (i.e. the temperatures at the first measurement point and the second measurement point located on the right and left sides as viewed in the negative direction of the Y axis) are measured to achieve the estimation of the direction of the convection flow, where, for instance, the convection flow can be estimated to be fixed clockwise when the temperature on the left side is higher than that on the right side, and the convection flow can be estimated to be fixed anticlockwise with the opposite measurement result.

By thus estimating the direction of the convection flow of the silicon melt which affects the oxygen concentration of the monocrystalline silicon, the oxygen concentration of the monocrystalline silicon can be estimated before the monocrystalline silicon is pulled up.

In the method according to the above aspect, it is preferable that the first measurement point and the second measurement point are located across a second imaginary line that passes through the center of the surface of the silicon melt and is in parallel with the central magnetic field line of the horizontal magnetic field as viewed vertically from above.

With this arrangement, a temperature difference between the first and second measurement points can be increased, so that the direction of the convection flow can be estimated with a high accuracy.

In the method according to the above aspect, it is preferable that the first measurement point is located in a negative direction of an X axis with respect to the second measurement point in a right-handed XYZ Cartesian coordinate system defining a center of the surface of the silicon melt as an origin, a vertically upward direction as a positive direction of a Z axis, and a direction in which the horizontal magnetic field is applied as a positive direction of a Y axis, and in the estimating of the direction of the convection flow, as viewed in a negative direction of the Y axis, the direction of the convection flow is estimated to be fixed clockwise when the temperature at the first measurement point is higher than the temperature at the second measurement point, and the direction of the convection flow is estimated to be fixed anticlockwise when the temperature at the first measurement point is lower than the temperature at the second measurement point.

In the method according to the above aspect, it is preferable that, provided that a distance from the center of the surface of the silicon melt to the first measurement point is denoted as R1, a distance from the center to the second measurement point is denoted as R2, and a radius of an inner diameter of the quartz crucible is denoted as RC, the first measurement point P1 satisfying a formula (1) below and the second measurement point satisfying a formula (2) below are measured, $$0.375 \leq R1/RC < 1 \quad (1)$$

$$0.375 \leq R2/RC < 1 \quad (2).$$

With this arrangement, a temperature difference between the first and second measurement points can be increased, so that the direction of the convection flow can be estimated with a high accuracy.

According to another aspect of the invention, an oxygen concentration estimation method includes: conducting the convection pattern estimation method according to the above aspect; and estimating an oxygen concentration in a straight body of monocrystalline silicon to be pulled up, on a basis of the prepared relationship between the direction of the convection flow and an oxygen concentration of the monocrystalline silicon, and the direction of the convection flow estimated by the convection pattern estimation method.

According to the above aspect of the invention, the oxygen concentration of to-be-pulled-up monocrystalline silicon can be appropriately estimated on a basis of the relationship between the direction of the convection flow and the oxygen concentration of monocrystalline silicon (i.e. the relationship showing that the oxygen concentration of the straight body is higher in the convection flow fixed clockwise than in the convection flow fixed anticlockwise in a predetermined thermal environment in a pull-up device), and the direction of the convection flow estimated on a basis of the measurement result of the first and second measurement points.

According to a further aspect of the invention, a manufacturing method of monocrystalline silicon includes: conducting the convection pattern estimation method according to the above aspect; and pulling up the monocrystalline silicon, in which, in the pulling up of the monocrystalline silicon, when the estimated direction of the convection flow is not a predetermined direction, the intensity of the horizontal magnetic field is lowered to less than 0.01 tesla and subsequently increased to 0.2 tesla or more, and subsequently temperatures at the first measurement point and the second measurement point are measured, and when the estimated direction of the convection flow is the predetermined direction, the monocrystalline silicon is pulled up on a basis of predetermined pull-up conditions while the intensity of the horizontal magnetic field is kept at 0.2 tesla or more.

According to the above aspect of the invention, only when the estimated direction of the convection flow is identical with the predetermined direction, the monocrystalline silicon is pulled up under the predetermined pulling conditions, so that the monocrystalline silicon having the desired oxygen concentration is obtainable without significantly changing the pull-up conditions, and a variation in oxygen concentration among ingots of the monocrystalline silicon can be restrained.

According to a still further aspect of the invention, a manufacturing method of monocrystalline silicon includes: conducting the oxygen concentration estimation method of the monocrystalline silicon according to the above aspect; and pulling up the monocrystalline silicon, in which in the pulling up of the monocrystalline silicon, the monocrystalline silicon is pulled up while the intensity of the horizontal magnetic field is kept at 0.2 tesla or more and at least one of a flow rate of inert gas flowing in a chamber of a pull-up device, an internal pressure of the chamber and a rotation speed of the quartz crucible is adjusted on a basis of the estimated oxygen concentration.

According to the above aspect of the invention, monocrystalline silicon having a desired oxygen concentration can be manufactured by controlling the flow rate of the inert gas, the internal pressure of the chamber, or the rotation speed of the quartz crucible based on the estimated oxygen concentration. Accordingly, the monocrystalline silicon having the desired oxygen concentration can be obtained, the variation in the oxygen concentration among the ingots of the monocrystalline silicon can be restrained, and the manufacturing efficiency of the monocrystalline silicon can be improved.

According to a still further aspect of the invention, a pull-up device of monocrystalline silicon includes: a quartz crucible; magnetic-field applying portions located across the quartz crucible and configured to apply a horizontal magnetic field to a silicon melt in the quartz crucible; and a temperature sensor configured to measure temperatures at a first measurement point and a second measurement point both positioned on a first imaginary line that passes through a center of a surface of the silicon melt and is not in parallel with a central magnetic field line on the horizontal magnetic field.

In the pull-up device according to the above aspect, it is preferable that the first measurement point and the second measurement point are located across a second imaginary line that passes through the center of the surface and is in parallel with the central magnetic field line of the horizontal magnetic field.

In the pull-up device according to the above aspect, it is preferable that the temperature sensor measures the first measurement point satisfying the above formula (1) below and the second measurement point satisfying the above formula (2) below, provided that a distance from the center of the surface of the silicon melt to the first measurement point is denoted as R1, a distance from the center of the surface of the silicon melt to the second measurement point is denoted as R2, and a radius of an inner diameter of the quartz crucible is denoted as RC.

In the pull-up device according to the above aspect, it is preferable that the temperature sensor includes: a pair of reflectors provided inside a chamber in which the quartz crucible is provided, and each configured to reflect corresponding one of radiation lights from the first measurement point and the second measurement point; and a pair of radiation thermometers provided outside the chamber and configured to receive the radiation lights reflected on the respective reflectors and measure temperatures at the first measurement point and the second measurement point.

With this arrangement, a lifetime of the pull-up device can be prolonged by disposing the radiation thermometers outside the chamber.

In the pull-up device according to the above aspect, it is preferable that the pair of reflectors are positioned such that a distance from a lower end of each of the reflectors to the surface of the silicon melt is in a range from 600 mm to 5000 mm.

With this arrangement, by providing the reflectors at positions apart by 600 mm or more from the surface of the silicon melt, the reflectors can be prevented from being worn by heat of the silicon melt and the reflection surface can be prevented from being clouded by SiO gas generating from the silicon melt. Moreover, by providing the reflectors at positions apart by 5000 mm or less from the surface of the silicon melt, ambient light due to multiple reflections in the chamber can be prevented from entering the reflectors, and the measurement with the radiation thermometers can be performed with a high accuracy.

In the pull-up device according to the above aspect, it is preferable that the pair of reflectors each have a reflection surface, and the reflection surface is positioned such that an angle of the reflection surface to a horizontal plane is in a range from 40 degrees to 50 degrees.

With this arrangement, ambient light due to multiple reflections in the chamber can be prevented from entering the reflectors, and the measurement with the radiation thermometers can be performed with a high accuracy.

It should be noted that the horizontal plane means a plane orthogonal to a gravity direction.

In the pull-up device according to the above aspect, it is preferable that the pull-up device further includes a convection pattern estimation portion configured to estimate a direction of a convection flow in the silicon melt in a plane orthogonal to a direction in which the horizontal magnetic field is applied, on a basis of the temperatures at the first measurement point and the second measurement point measured by the temperature sensor.

In the pull-up device according to the above aspect, it is preferable that the pull-up device further includes a pull-up controller configured to lower an intensity of the horizontal magnetic field to less than 0.01 tesla and subsequently increase the intensity of the horizontal magnetic field to 0.2 tesla or more and to control the temperature sensor to measure temperatures at the first measurement point and the second measurement point when the direction of the convection flow estimated by the convection pattern estimation portion is not a predetermined direction, and configured to pull up the monocrystalline silicon on a basis of predetermined pull-up conditions while the intensity of the horizontal magnetic field is kept at 0.2 tesla or more when the direction of the convection flow estimated by the convection pattern estimation portion is the predetermined direction.

In the pull-up device according to the above aspect, it is preferable that the pull-up device further includes: a storage configured to store a relationship between the direction of the convection flow and an oxygen concentration of the monocrystalline silicon; an oxygen concentration estimation portion configured to estimate an oxygen concentration in a straight body of the pulled up monocrystalline silicon on a basis of the direction of the convection flow estimated by the convection pattern estimation portion and the relationship stored in the storage; and a pull-up controller configured to adjust at least one of a flow rate of inert gas flowing in a chamber, an internal pressure of the chamber and a rotation speed of the quartz crucible on a basis of the oxygen concentration estimated by the oxygen concentration estimation portion while the intensity of the horizontal magnetic field is kept at 0.2 tesla or more, and to pull up the monocrystalline silicon.

BRIEF DESCRIPTION OF DRAWING(S)

FIG. 1 schematically shows an arrangement of a pull-up device according to a first exemplary embodiment of the invention.

FIG. 2 schematically shows how a horizontal magnetic field is applied and positions of first and second measurement points in the first exemplary embodiment and a second exemplary embodiment of the invention.

FIG. 3 schematically shows a layout of temperature sensors in the first and second exemplary embodiments.

FIG. 4 is a block diagram showing a relevant part of the pull-up device in the first exemplary embodiment.

FIG. 5A schematically shows a relationship between the application direction of the horizontal magnetic field and a direction of a convection flow in the silicon melt in the first and second exemplary embodiments of the invention, showing a clockwise convection flow.

FIG. 5B schematically shows a relationship between the application direction of the horizontal magnetic field and a direction of a convection flow in the silicon melt in the first and second exemplary embodiments of the invention, showing an anticlockwise convection flow.

FIG. 6 schematically shows a change in the convection flow in the silicon melt in the first and second exemplary embodiments.

FIG. 7 is a flowchart showing a manufacturing method of monocrystalline silicon in the first exemplary embodiment.

DESCRIPTION OF EMBODIMENT(S)

Exemplary embodiments of the invention will be described below with reference to the attached drawings.

[1] First Exemplary Embodiment

Figure 1:
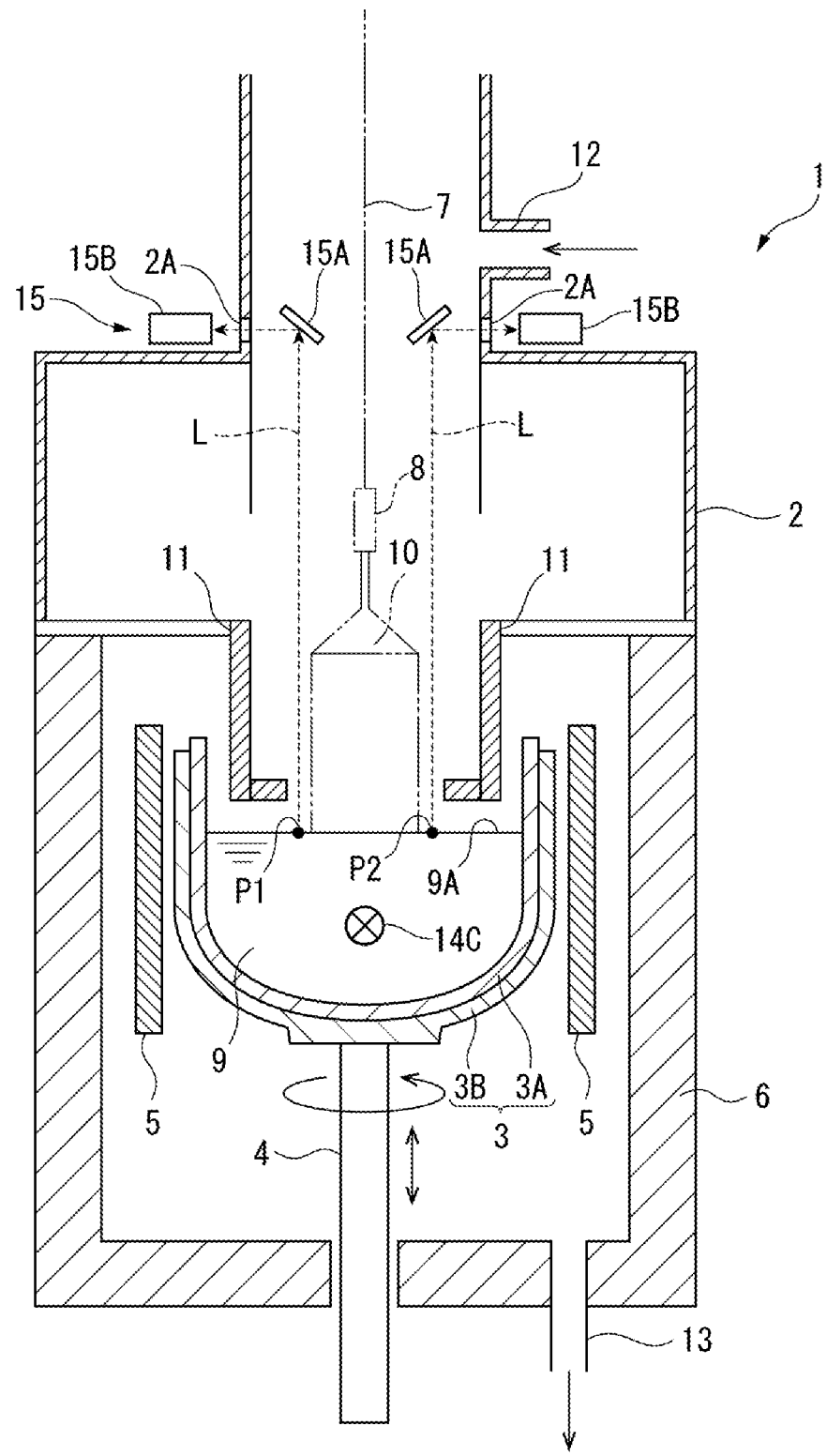

FIG. 1 schematically illustrates an exemplary structure of a pull-up device 1 of monocrystalline silicon to which a manufacturing method of monocrystalline silicon 10 according to a first exemplary embodiment of the invention is applicable. The pull-up device 1, which is a device for pulling up the monocrystalline silicon 10 through the Czochralski method, includes a chamber 2 forming an outer shell and a crucible 3 disposed at the center of the chamber 2.

The crucible 3, which has a double structure of an inner quartz crucible 3A and an outer graphite crucible 3B, is fixed to an upper end of a support shaft 4 that is rotatable and movable up and down.

A resistance heating type heater 5 is provided outside the crucible 3 in a manner to surround the crucible 3. A heat insulation material 6 is provided outside the heater 5 and along an inner surface of the chamber 2.

A pull-up shaft 7 (e.g., a wire), which is coaxial with the support shaft 4 and configured to rotate at a predetermined speed in a direction opposite to or the same as the rotation direction of the support shaft 4, is provided above the crucible 3. A seed crystal 8 is attached to a lower end of the pull-up shaft 7.

A hollow cylindrical heat shield 11, which surrounds the growing monocrystalline silicon 10, is disposed in the chamber 2 at a part above a silicon melt 9 in the crucible 3.

The heat shield 11, which shields the growing monocrystalline silicon 10 from high-temperature radiation heat from the silicon melt 9 in the crucible 3, the heater 5 and a side wall of the crucible 3, prevents outward heat diffusion from a solid-liquid interface, which is an interface on which crystal grows, and a vicinity thereof, whereby the heat shield 11 serves to control a temperature gradient of a central portion and an outer peripheral portion of the monocrystalline silicon in a direction of the pull-up shaft.

A gas inlet 12, through which an inert gas (e.g. Argon gas) is introduced into the chamber 2, is provided at an upper part of the chamber 2. An exhaust outlet 13, through which the gas in the chamber 2 is sucked and discharged when a vacuum pump (not shown) is driven, is provided at a lower part of the chamber 2. The inert gas introduced in the chamber 2 through the gas inlet 12, which flows downward between the growing monocrystalline silicon 10 and the heat shield 11 and then flows into a space between a lower end of the heat shield 11 and a liquid surface of the silicon melt 9, flows toward an outside of the heat shield 11 and an outside of the crucible 3 and then downward along the outside of the crucible 3, to be discharged from the exhaust outlet 13.

Figure 2:
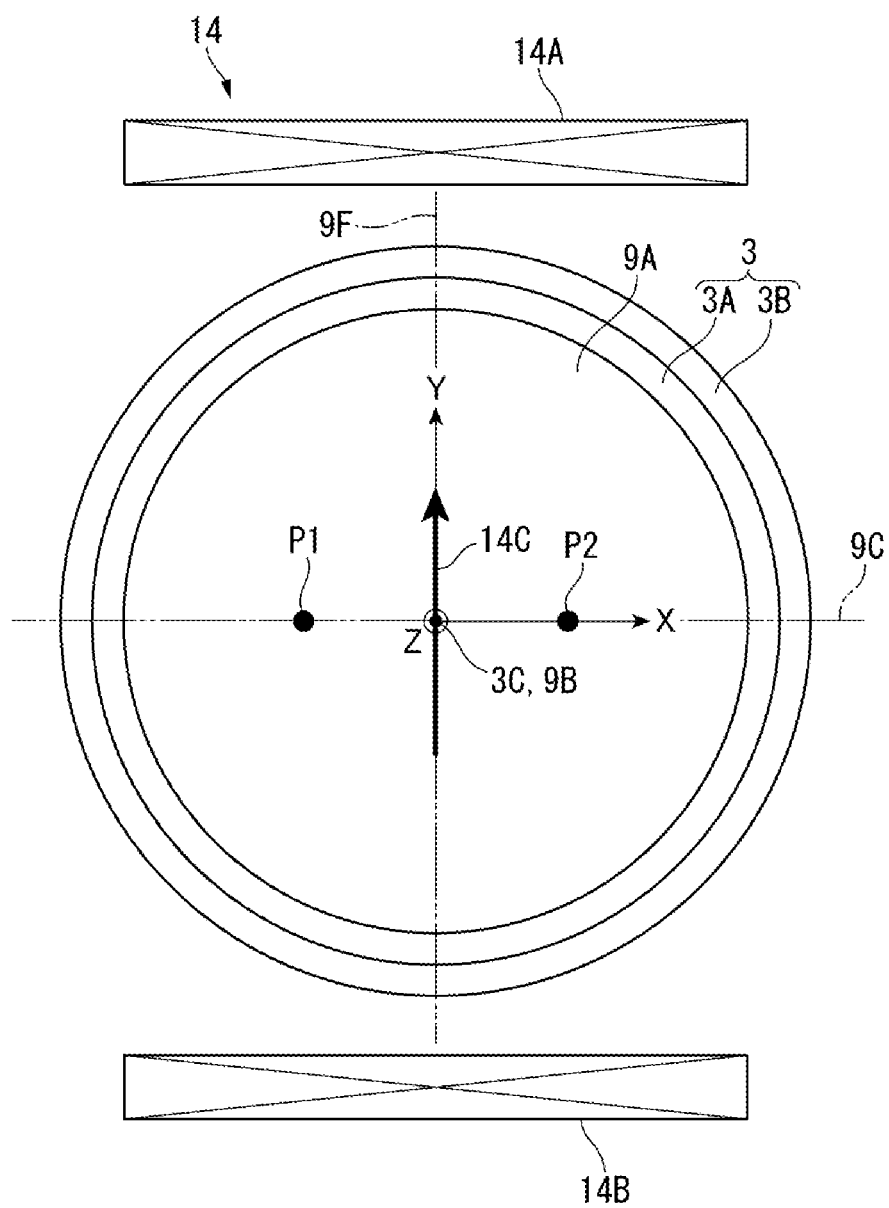

The pull-up device 1 includes a magnetic-field applying portion 14 as shown in FIG. 2 and a temperature sensor 15.

The magnetic-field applying portion 14 includes a first magnetic body 14A and a second magnetic body 14B each in a form of a solenoid coil. The first and second magnetic bodies 14A and 14B are provided outside the chamber 2 in a manner to face each other across the crucible 3. The magnetic-field applying portion 14 preferably applies a horizontal magnetic field such that a central magnetic field line 14C passes through a center axis 3C of a quartz crucible 3A and the central magnetic field line 14C is directed in a top direction in FIG. 2 (i.e., a direction from a nearby side to a far side on a paper in FIG. 1). A height of the central magnetic field line 14C, which is not particularly limited, may be determined such that the central magnetic field line 14C passes through an inside or an outside of the silicon melt 9 depending on the quality of the monocrystalline silicon 10.

Figure 3:
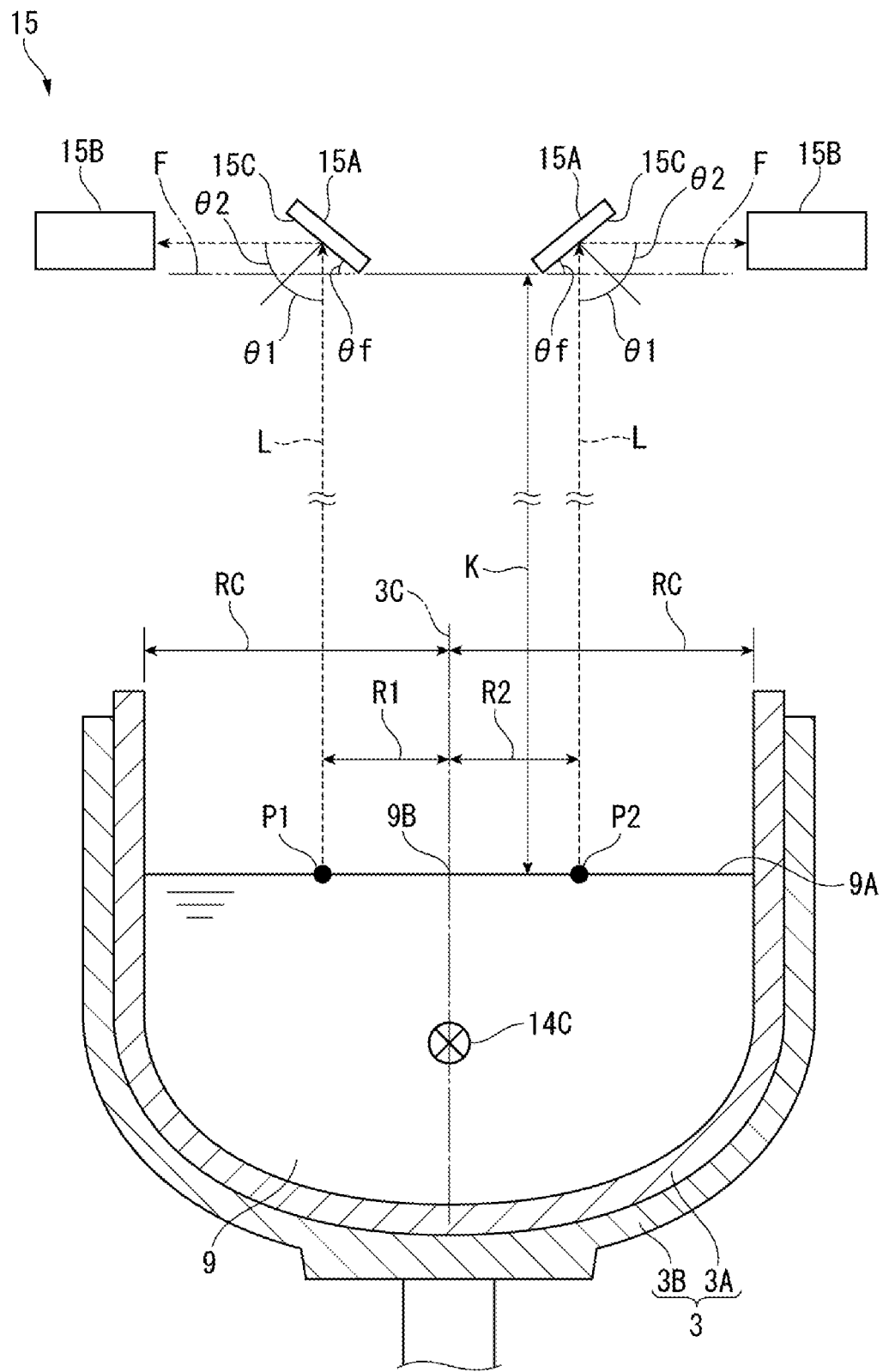

The temperature sensor 15 measures temperatures at a first measurement point P1 and a second measurement point P2 on a surface 9A of the silicon melt 9, the first and second measurement points being positioned on a first imaginary line 9C that passes through a center 9B of the surface 9A of the silicon melt 9 and is not in parallel with the central magnetic field line 14C on the horizontal magnetic field as viewed vertically from above, as shown in FIGS. 1 to 3.

The first measurement point P1 is located in a negative direction of an X axis (i.e., the left side in FIG. 2) with respect to the second measurement point P2 in a right-handed XYZ Cartesian coordinate system defining the center 9B as an origin, an vertically upward direction as a positive direction of a Z axis (i.e., an upward direction in FIG. 1 and a direction toward a nearby side on the sheet of FIG. 2), and a direction to which the horizontal magnetic field is applied as a positive direction of a Y axis (a direction toward a far side in FIG. 1 and an upward direction in FIG. 2). When viewed from the above in the vertical direction, the first measurement point P1 and the second measurement point P2 are preferably located across a second imaginary line 9F that passes through the center 9B and is in parallel with the central magnetic field line 14C of the horizontal magnetic field. In the first exemplary embodiment, the first imaginary line 9C is orthogonal to the second imaginary line 9F.

Provided that a distance from the center 9B of the surface 9A of the silicon melt 9 to the first measurement point P1 is denoted as R1, a distance from the center 9B to the second measurement point P2 is denoted as R2, and a radius of an inner diameter of the quartz crucible 3A is denoted as RC, the temperature sensor 15 preferably measures the first measurement point P1 satisfying a formula (3) below and the second measurement point P2 satisfying a formula (4) below.

$$0.375 \leq R1/RC < 1 \qquad (3)$$

$$0.375 \leq R2/RC < 1 \qquad (4)$$

A value of R1/RC and a value of R2/RC may be mutually the same or different. The first imaginary line 9C may pass or not pass through the center 9B of the surface 9A. The first imaginary line 9C may not be orthogonal to the second imaginary line 9F.

The temperature sensor 15 includes a pair of reflectors 15A and a pair of radiation thermometers 15B.

The reflectors 15A are provided inside the chamber 2. The reflectors 15A are preferably provided such that a distance (height) K from each of lower ends of the reflectors 15A to the surface 9A of the silicon melt 9 is in range from 600 mm to 5000 mm as shown in FIG. 3. Moreover, the reflectors 15A are preferably provided such that an angle θf formed by a reflection surface 15C of each of the reflectors 15A and a horizontal plane F is in a range from 40 degrees to 50 degrees. With this arrangement, a sum of an incidence angle θ1 and a reflection angle θ2 of a radiation light L radiated from each of the first and second measurement points P1, P2 in a direction opposite to a gravity direction is in a range from 80 degrees to 100 degrees. The reflectors 15A are preferably in a form of a silicon mirror having a mirror-polished surface as the reflection surface 15C.

The radiation thermometers 15B are provided outside the chamber 2. The radiation thermometers 15B receive the radiation light L incident through quartz windows 2A provided to the chamber 2 and measure the temperatures at the first and second measurement points P1, P2 in a non-contact manner.

Figure 4:
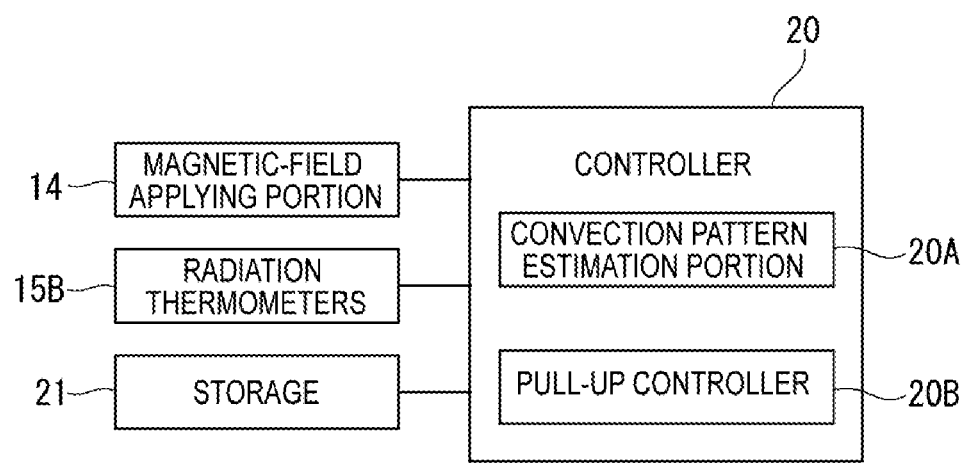

Moreover, the pull-up device 1 incudes a controller 20 and a storage 21 as shown in FIG. 4.

The controller 20 includes a convection pattern estimation portion 20A and a pull-up controller 20B.

The convection pattern estimation portion 20A estimates a direction of a convection flow 90 (see FIGS. 5A and 5B) in a field-orthogonal cross-section (a plane orthogonal to the direction in which the horizontal magnetic field is applied) of the silicon melt 9 as viewed in the negative direction of the Y axis in FIG. 2 (the lower side in FIG. 2), based on the measurement result by the temperature sensor 15.

The pull-up controller 20B pulls up the monocrystalline silicon 10 on a basis of the estimation result on the direction of the convection flow 90 by the convection pattern estimation portion 20A.

[2] Background for Invention

The inventors have known that, even if the monocrystalline silicon 10 is pulled up using the same pull-up device 1 under the same pull-up conditions, an oxygen concentration of the pulled-up monocrystalline silicon 10 may sometimes become high or low. In order to solve this problem, a research has been typically focused on the pull-up conditions and the like. However, no definitive solution has been found.

Figure 5A:
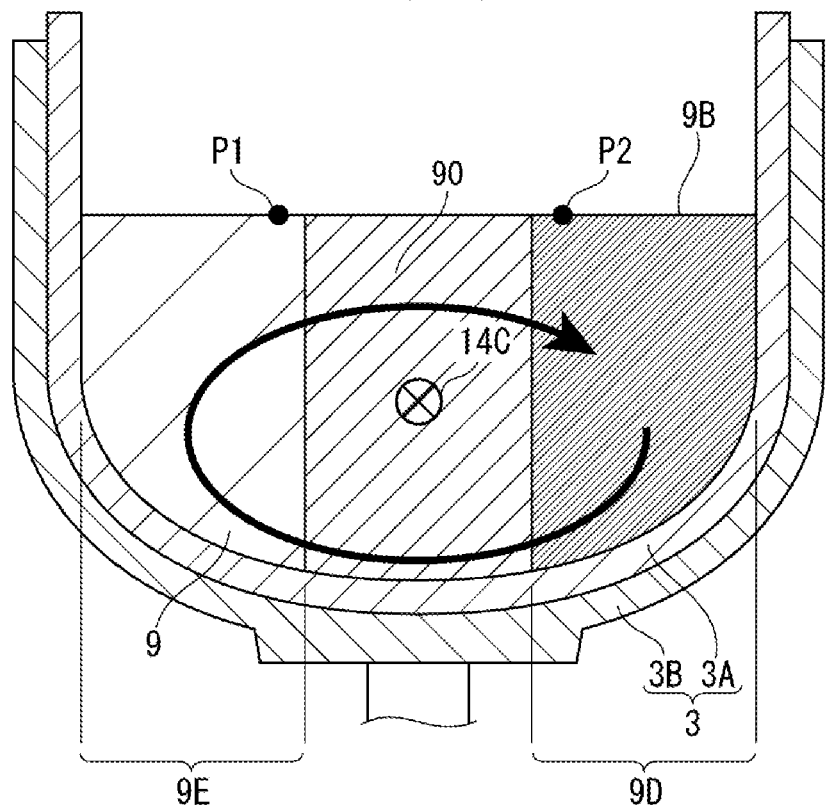
Figure 5B:
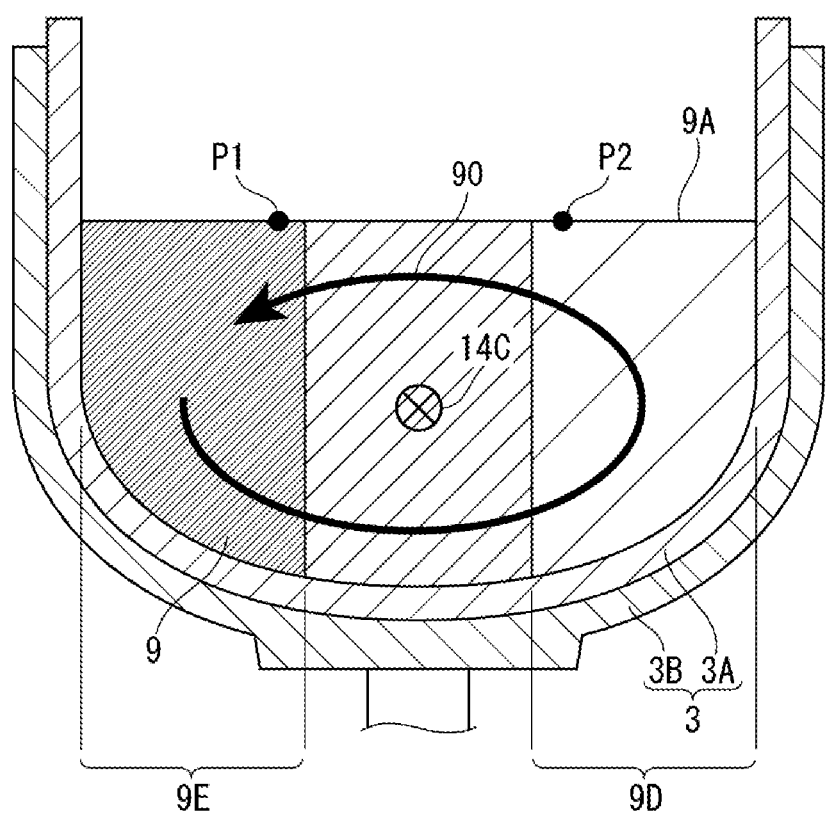

After further research, the inventors have found that, when a solid polycrystalline silicon feedstock is put into the quartz crucible 3A to be dissolved therein and a horizontal magnetic field is applied, the convection flow 90 rotating in a direction from the bottom of the quartz crucible 3A toward the surface 9A of the silicon melt 9 around magnetic field lines of the horizontal magnetic field is observed in the field-orthogonal cross-section (i.e., a cross-sectional plane viewed from the second magnetic body 14B (from the nearby side of the sheet of FIG. 1)). The rotation direction of the convection flow 90 is shown in two convection patterns of a case where a clockwise rotation is dominant as shown in FIG. 5A and a case where an anticlockwise rotation is dominant as shown in FIG. 5B.

The inventors have speculated that the occurrence of such a phenomenon is due to the following mechanism.

First, in a state where the horizontal magnetic field is not applied and the quartz crucible 3A is not rotated, the silicon melt 9 is heated in the vicinity of an outer periphery of the quartz crucible 3A, a convection flow occurs in an ascending direction from the bottom of the silicon melt 9 toward the surface 9A. The ascending silicon melt 9 is cooled at the surface 9A of the silicon melt 9, returns to the bottom of the quartz crucible 3A at the center of the quartz crucible 3A, so that a convection flow occurs in a descending direction.

When the convection flow that ascends in the outer periphery of the outer periphery and descends at the center thereof occurs, a position of the downward flow randomly shifts to be offset from the center due to instability of thermal convection. Such a downward flow is generated by a temperature distribution in which the temperature at a part of the surface 9A of the silicon melt 9 corresponding to the downward flow is the lowest and the temperature gradually increases toward an outer part of the surface 9A. For instance, in a state of FIG. 6(A), a temperature of a first region A1 whose center is displaced from the rotation center of the quartz crucible 3A is the lowest, and temperatures of a second region A2, a third region A3, fourth region A4 and a fifth region A5 which are sequentially located outside of the first region A1 become higher in this order.

In the state of FIG. 6(A), when a horizontal magnetic field whose central magnetic field line 14C passes through the central axis 3C of the quartz crucible 3A is applied, rotation of the downward flow is gradually restrained when viewed from above the quartz crucible 3A, and is then restrained at a position offset from the position of the magnetic field line 14C at the center of the horizontal magnetic field as shown in FIG. 6(B).

It is considered that the rotation of the downward flow is restrained after an intensity of the horizontal magnetic field acting on the silicon melt 9 becomes larger than a specific strength. Accordingly, the rotation of the downward flow is not restrained immediately after the application of the horizontal magnetic field is started, but is restrained after a predetermined time has elapsed from the start of the application.

It is reported that a change in the flow inside the silicon melt 9 due to the application of the magnetic field is generally represented by a magnetic number M, which is a dimensionless number obtained by a formula (5) below (Jpn. J. Appl. Phys., Vol. 33 (1994) Part. 2 No. 4A, pp. L487-490).

Numerical Formula 1

$$M = \frac{\sigma B_0^2 h}{\rho v_0} \qquad (5)$$

In the formula (5), σ represents an electric conductivity of the silicon melt 9, Bo represents the applied magnetic flux density, h represents a depth of the silicon melt 9, ρ represents a density of the silicon melt 9, and $v_0$ represents an average flow velocity of the silicon melt 9 in the absence of the magnetic field.

In an exemplary embodiment, it has been found that the minimum value of the specific strength of the horizontal magnetic field in which the rotation of the downward flow is restrained is 0.01 tesla. Magnetic Number at 0.01 tesla is 1.904. Even with the amount of the silicon melt 9 and the diameter of the quartz crucible 3A different from those of the exemplary embodiment, it is considered that the restraining effect (braking effect) of the downward flow by the magnetic field occurs at least at the magnetic field strength (magnetic flux density) at which Magnetic Number is 1.904.

When the intensity of the horizontal magnetic field is further increased from the state shown in FIG. 6(B), the magnitude of the convection flow in the ascending direction on the right side and the left side of the descending flow changes as shown in FIG. 6 (C), where the upward convection flow on the left side of the downward flow becomes dominant.

Finally, when the magnetic field strength reaches 0.2 tesla, the convection flow in the ascending direction on the right side of the descending flow disappears as shown in FIG. 6(D), where the convection flow flows upward (i.e. in the ascending direction) on the left side and downward (i.e. in the descending direction) on the right side to create the clockwise convection flow 90. In the state of the clockwise convection flow 90, as shown in FIG. 5A, the temperature gradually is increased from the right region 9D toward the left region 9E of the silicon melt 9 in the magnetic-field orthogonal cross-section.

In contrast, if a start position of the downward flow in FIG. 6 (A) is shifted by 180 degrees in the rotation direction of the quartz crucible 3A, the downward flow is restrained at a position on the left side where a phase is shifted by 180 degrees from that in FIG. 6(C), resulting in the anticlockwise convection flow 90. In the state of the anticlockwise convection flow 90, as shown in FIG. 5B, the temperature is gradually decreased from the right region 9D toward the left region 9E of the silicon melt 9.

Such a clockwise or anticlockwise convection flow 90 of the silicon melt 9 is maintained unless the intensity of the horizontal magnetic field is set to less than 0.2 tesla.

Further, since the pull-up device 1, which is symmetrically designed, is not actually symmetric, the thermal environment therein is also not symmetric. The asymmetry of the thermal environment is exemplarily caused by that the asymmetric shapes of the members such as the chamber 2, the crucible 3, the heater 5, and the heat shield 11, and the asymmetric installation positions of various components in the chamber 2.

For instance, in the field-orthogonal cross-section, the pull-up device 1 may create therein a first thermal environment in which the temperature on the left side is higher than that on the right side of the quartz crucible 3A or a second thermal environment in which the temperature on the left side is lower than that on the right side.

Under the first thermal environment, when the convection flow 90 is fixed clockwise in the magnetic-field orthogonal cross-section, the left region 9E of the silicon melt 9 becomes higher in temperature due to the synergistic effect with the first thermal environment. Accordingly, the amount of oxygen eluted from the quartz crucible 3A increases as shown in Table 1 below. In contrast, when the convection flow 90 is fixed anticlockwise, the synergistic effect with the first thermal environment as in the case of the clockwise rotation does not occur and the left region 9E does not become so high in temperature. Accordingly, the amount of oxygen eluted from the quartz crucible 3A becomes not so high as that in the clockwise convection flow 90.

Accordingly, under the first thermal environment, it is presumed that the oxygen concentration of the monocrystalline silicon 10 is high when the convection flow 90 is clockwise, and is not high (low) when the convection flow 90 is anticlockwise.

TABLE 1

| Thermal enviroment | Surface temperature of silicon melt | Direction of convection | Amount of oxygen eluted from quartz crucible | Oxygen concentration of straight body |
| --- | --- | --- | --- | --- |
| First thermal enviroment (higher temperature on left side) | First measurement point P1 > Second measurement point P2 | clockwise | large | high |
| | First measurement point P1 < Second measurement point P2 | anticlockwise | normal | low |

Under the second thermal environment, when the convection flow 90 is fixed anticlockwise, the right region 9D of the silicon melt 9 becomes higher in temperature. Accordingly, the amount of oxygen eluted from the quartz crucible 3A increases as shown in Table 2. In contrast, when the convection flow 90 is fixed clockwise, the right region 9E does not become so high in temperature unlike the anticlockwise convection flow 90. Accordingly, the amount of oxygen eluted from the quartz crucible 3A becomes not so high.

Accordingly, under the second thermal environment, it is presumed that the oxygen concentration of the monocrystalline silicon 10 is high when the convection flow 90 is estimated to be anticlockwise, and the oxygen concentration is low when the convection flow 90 is estimated to be clockwise.

TABLE 2

| Thermal enviroment | Surface temperature of silicon melt | Direction of convection | Amount of oxygen eluted from quartz crucible | Oxygen concentration of straight body |
| --- | --- | --- | --- | --- |
| Second thermal enviroment (higher temperature on left side) | First measurement point P1 < Second measurement point P2 | anticlockwise | large | high |
| | First measurement point P1 > Second measurement point P2 | clockwise | normal | low |

From the above, the inventors have considered that the oxygen concentration of the monocrystalline silicon 10 can be estimated with a high accuracy by grasping the direction of the convection flow 90 of the silicon melt 9 by measuring the temperatures of the first and second measurement points P1, P2 on the surface 9A of the silicon melt 9, and the asymmetric structure of an internal environment of a furnace of the pull-up device 1.

[3] Manufacturing Method of Monocrystalline Silicon

Next, a manufacturing method of monocrystalline silicon in the first exemplary embodiment will be described with reference to the flowchart shown in FIG. 7.

Firstly, it should be understood that the thermal environment of the pull-up device 1 is the first thermal environment or the second thermal environment described above.

Further, when the direction of the convection flow 90 of the silicon melt 9 is clockwise or anticlockwise, pull-up conditions (e.g., a flow rate of inert gas, an internal pressure of the chamber 2, and a rotation speed of the quartz crucible 3A) for achieving a desired value of the oxygen concentration of the monocrystalline silicon 10 are determined in advance as predetermined conditions, and the pull-up conditions are stored in the storage 21.

For instance, as shown in Table 3 below, under the first thermal environment, when the direction of the convection flow 90 is clockwise, pull-up conditions A to achieve a concentration A for the oxygen concentration are stored as the predetermined conditions. The oxygen concentration of the predetermined conditions may be values of the oxygen concentration at a plurality of points in the longitudinal direction of the straight body, or may be an average of the values of the oxygen concentration at the plurality of points.

TABLE 3

| Thermal environment | Direction of convection flow | Pull-up conditions | Oxygen concentration of straight body |
|---|---|---|---|
| First thermal environment (higher temperature on left side) | clockwise | Pull-up conditions A | Concentration A |

Manufacturing of the monocrystalline silicon 10 is then started.

Firstly, as shown in FIG. 7, while maintaining the inside of the chamber 2 in an inert gas atmosphere under reduced pressure, the pull-up controller 20B rotates the crucible 3 and the solid material such as polycrystalline silicon filled in the crucible 3 is melted by heat from the heater 5 to generate the silicon melt 9 (Step S1). Next, the pull-up controller 20B controls the magnetic-field applying portion 14 to start applying the horizontal magnetic field whose strength is in a range from 0.2 tesla to 0.6 tesla to the silicon melt 9 (Step S2). Such an application of the horizontal magnetic field generates the clockwise convection flow 90 as shown in FIG. 5A or the anticlockwise convection flow 90 as shown in FIG. 5B in the magnetic-field orthogonal cross-section in the silicon melt 9.

After the direction of the convection flow 90 is fixed as shown in FIG. 5A or FIG. 5B, the temperature sensor 15 measures the temperatures of the first and second measurement points P1 and P2 (Step S3). Whether the direction of the convection flow 90 is fixed can be judged, for example, based on the elapsed time from the start of application of the horizontal magnetic field.

The convection pattern estimation portion 20A estimates that the clockwise convection flow 90 is present in the magnetic-field orthogonal cross-section when the temperature at the first measurement point P1 is higher than the temperature at the second measurement point P2, and estimates that the anticlockwise convection flow 90 is present in the magnetic-field orthogonal cross-section when the temperature at the first measurement point P1 is lower than the temperature at the second measurement point P2 (Step S4).

Subsequently, the pull-up controller 20B judges whether the estimation result of the direction of the convection flow 90 based on the temperatures at the first and second measurement points P1, P2 is identical with the direction determined in advance by the predetermined conditions (Step S5).

For instance, when the thermal environment in the pull-up device 1 is the first thermal environment and the predetermined conditions are for achieving a desired oxygen concentration in the clockwise convection flow 90, the pull-up controller 20B judges whether the estimation result of the direction of the convection flow 90 based on the temperatures at the first and second measurement points P1, P2 shows the clockwise direction.

When the convection flow 90 in the predetermined direction is present, the pull-up controller 20B dips the seed crystal 8 into the silicon melt 9 while continuously applying the horizontal magnetic field, and pulls up with the predetermined conditions the monocrystalline silicon 10 having a straight body having a desired oxygen concentration (Step S6).

On the other hand, the pull-up controller 20B suspends applying the horizontal magnetic field when the convection flow 90 in the predetermined direction is not present (Step S7). Subsequently, the pull-up controller 20B performs the processing of Step S2 and again applies the horizontal magnetic field. By thus suspending the application of the horizontal magnetic field and setting the magnetic field strength to 0 tesla, the state shown in FIG. 6(D) returns to the state shown in FIG. 6(A), and the center of the downward flow begins to rotate in the same direction as the quartz crucible 3A. Then, when the horizontal magnetic field of 0.2 tesla or more is reapplied at a predetermined timing, phenomena as shown in FIGS. 6(B) to 6(D) occur, and the convection flow 90 occurs in the direction different from or the same as the direction of the convection flow before the horizontal magnetic field is reapplied. It Step S7, the intensity of the horizontal magnetic field may be set in a range of more than 0 tesla and less than 0.01 tesla.

Subsequently, the processes of Steps S3 to S5 and S7 are repeated until the convection flow 90 occurs in the predetermined direction. When the convection flow 90 occurs in the predetermined direction, the process of Step S6 is performed to pull up the monocrystalline silicon 10.

For instance, provided that the pull-up conditions A shown in Table 3 are used as the pre-determined conditions, the processes of Steps S3 to S5 and S7 are repeated until the direction of the convection flow 90 is estimated to be clockwise, and when the direction of the convection flow 90 is estimated to be clockwise, the oxygen concentration in the straight body can be set at the concentration A by pulling up the monocrystalline silicon 10 under the pull-up conditions A.

The processes of Steps S1 to S7 described above correspond to the method of manufacturing monocrystalline silicon of the invention, and the processes of Steps S1 to S4 correspond to the method of estimating the convection pattern of the silicon melt of the invention.

It should be noted that the process of starting and suspending the application of the horizontal magnetic field in Steps S2 and S4 and the pull-up process in Step S6 may be performed by an operator's operation, and/or the determination process in Step S5 may be performed by the operator.

[4] Operations and Effects in First Exemplary Embodiment

According to the first exemplary embodiment as describe above, the direction of the convection flow 90 of the silicon melt 9, which affects the oxygen concentration of the monocrystalline silicon 10, can be estimated by only measuring the temperatures of the first and second measurement points P1, P2 of the silicon melt 9. Accordingly, the oxygen concentration of the pulled up monocrystalline silicon 10 can be estimated before the monocrystalline silicon 10 is pulled up.

Since the temperatures of the first and second measurement points P1, P2 that satisfy the relationships of the formulae (3) and (4) are measured, a difference between the temperatures can be increased, so that the direction of the convection flow 90 of the silicon melt 9 can be estimated with a high accuracy.

Only when the estimated direction of the convection flow 90 is identical with the direction determined by the predetermined conditions, the monocrystalline silicon 10 is pulled up under the predetermined pulling conditions. Accordingly, the monocrystalline silicon 10 having the desired oxygen concentration is obtainable without significantly changing the pull-up conditions, and a variation in oxygen concentration among ingots of the monocrystalline silicon 10 can be restrained.

The reflected light from the reflectors 15A inside the chamber 2 is received by the radiation thermometers 15B outside the chamber 2, thereby measuring the temperatures of the first and second measurement points P1, P2. Accordingly, the radiation thermometers 15B can be prevented from being deteriorated due to heat to prolong the lifetime.

Since the distance K from the lower end of each of the reflectors 15A to the surface 9A of the silicon melt 9 is set to 600 mm or more, the reflectors 15A can be prevented from being worn due to the heat of the silicon melt 9. Further, since the distance K is set to 5000 mm or less, ambient light due to multiple reflections in the chamber 2 can be prevented from entering the reflectors 15A, and the measurement with the radiation thermometers 15B can be performed with a high accuracy.

Since the reflectors 15A are installed so that the sum of the incident angle and the reflection angle of the radiation light L falls in a range from 80 degrees to 100 degrees, ambient light due to multiple reflections in the chamber 2 can be prevented from entering the reflectors 15A, and the measurement with the radiation thermometers 15B can be performed with a higher accuracy.

[5] Second Exemplary Embodiment

Next, a second exemplary embodiment of the invention will be described. In the following description, the same reference numerals will be given to the components already described and the description thereof will be omitted.

The second exemplary embodiment is different from the first exemplary embodiment in the structure of the controller 30 and a manufacturing method of the monocrystalline silicon.

Figure 8:
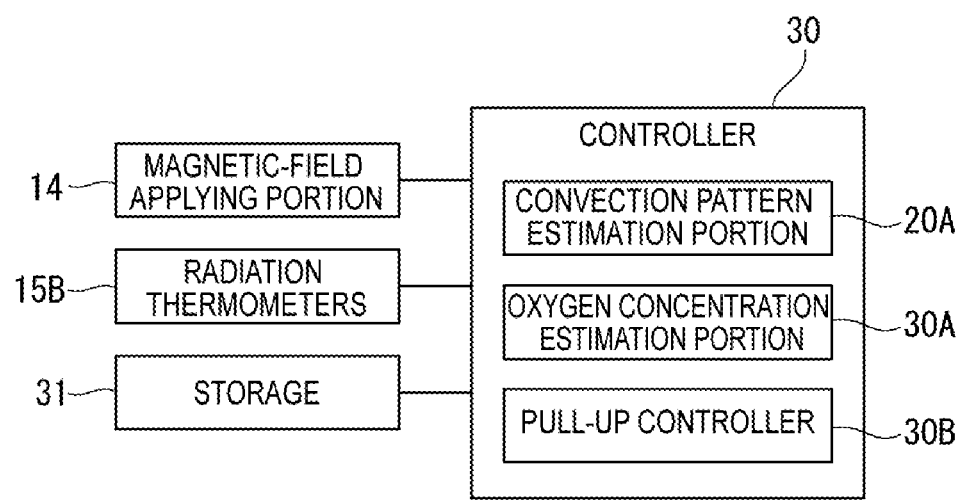
FIG. 8 is a block diagram showing a relevant part of a pull-up device in the second exemplary embodiment.

As shown in FIG. 8, the controller 30 includes a convection pattern estimation portion 20A, an oxygen concentration estimation portion 30A, and a pull-up controller 30B.

The oxygen concentration estimation portion 30A estimates an oxygen concentration of the monocrystalline silicon 10 based on the estimation result on the direction of the convection flow 90 by the convection pattern estimation portion 20A.

The pull-up controller 30B pulls up the monocrystalline silicon 10 based on the estimation result on the oxygen concentration by the oxygen concentration estimation portion 30A.

[6] Manufacturing Method of Monocrystalline Silicon

Next, the manufacturing method of monocrystalline silicon in the second exemplary embodiment will be described with reference to the flowchart shown in FIG. 9.

Firstly, it should be understood that the thermal environment of the pull-up device 1 is the first thermal environment or the second thermal environment described above.

Further, the pull-up conditions for achieving a desired value of the oxygen concentration of the monocrystalline silicon 10 in the clockwise or anticlockwise convection flow 90 of the silicon melt 9 are stored in a storage 31 as predetermined conditions. Also, information about whether the oxygen concentration becomes higher or lower than the desired value when the monocrystalline silicon 10 is pulled up under the predetermined conditions in a direction opposite to the direction of the convection flow 90 corresponding to the determination conditions is stored in the storage 31. In other words, a relationship between the direction of the convection flow 90 and the oxygen concentration is stored in the storage 31.

For instance, as shown in Table 4 below, under the first thermal environment, when the direction of the convection flow 90 is clockwise, the pull-up conditions A for achieving the oxygen concentration to be the concentration A are stored in the storage 31 as the predetermined condition, and information for achieving the oxygen concentration to be a concentration B lower than the concentration A when the monocrystalline silicon 10 is pulled up under the pull-up conditions A and the direction of the convection flow 90 is anticlockwise is stored in the storage 31. The oxygen concentration of the predetermined condition may be values of the oxygen concentration at a plurality of points in the longitudinal direction of the straight body, or may be an average of the values of the oxygen concentration at the plurality of points.

TABLE 4

| Thermal environment | Direction of convection flow | Pull-up conditions | Oxygen concentration of straight body |
|---|---|---|---|
| First thermal environment (higher temperature on left side) | clockwise | Pull-up conditions A | Concentration A |
| | anti-clockwise | Pull-up conditions A | Concentration B (<Concentration A) |

Manufacturing of the monocrystalline silicon 10 is then started.

Figure 9:
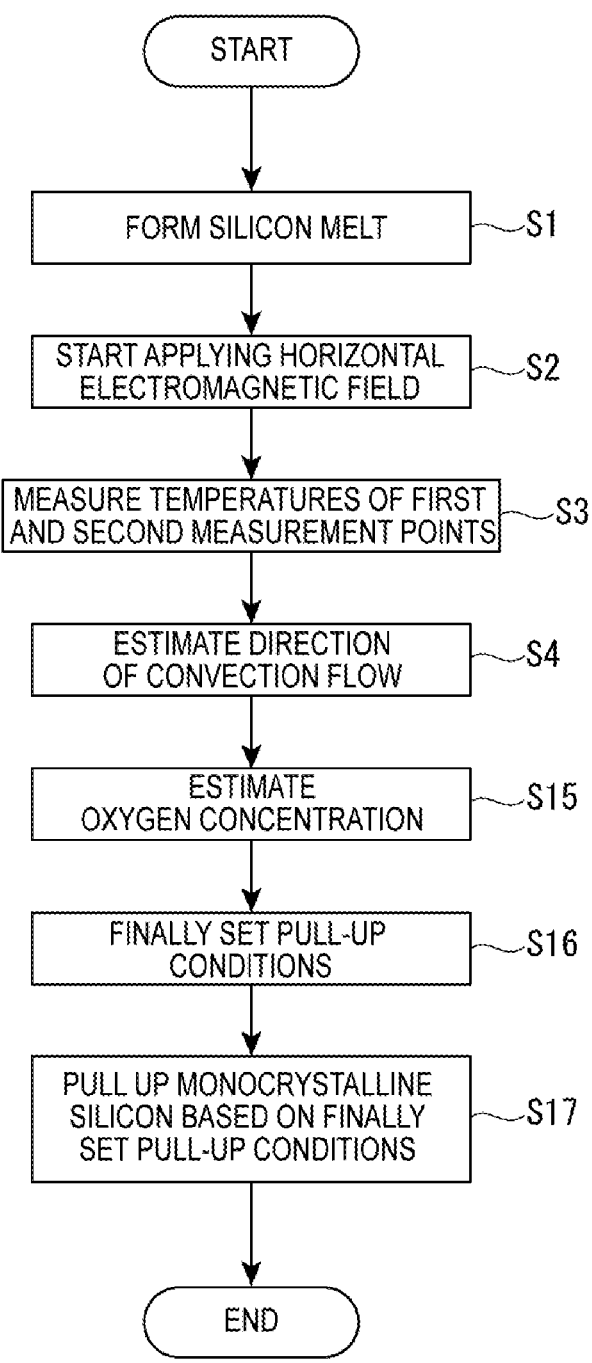
FIG. 9 is a flowchart showing a manufacturing method of monocrystalline silicon in the second exemplary embodiment.

Firstly, the pull-up controller 30B, the temperature sensor 15, and a convection pattern estimation portion 20A perform the processes of Step S1 to S4 as shown in FIG. 9.

Next, the pull-up controller 30B estimates the oxygen concentration of a to-be-pulled-up monocrystalline silicon 10 on a basis of the estimation result of the direction of the convection flow 90 by the convection pattern estimation portion 20A and the information stored in the storage 31 (Step S15).

For instance, when the convection flow 90 is estimated to be clockwise in the first thermal environment in the pull-up device 1 and the predetermined conditions are for achieving a desired oxygen concentration in the clockwise convection flow 90, the pull-up controller 30B estimates that the oxygen concentration of the monocrystalline silicon 10 becomes the desired oxygen concentration. On the other hand, when the convection flow 90 is estimated to be anticlockwise and if the information stored in the storage 31 indicates that the oxygen concentration of the monocrystalline silicon 10 will fall below the desired value when the monocrystalline silicon 10 is pulled up under the predetermined conditions in the anticlockwise convection flow 90, the pull-up controller 30B estimates that the oxygen concentration of the monocrystalline silicon 10 becomes lower than the desired oxygen concentration.

Next, the pull-up controller 30B performs the final setting of the pull-up conditions (Step S16). Specifically, in Step S15, the pull-up controller 30B sets the predetermined conditions as the final pull-up conditions when it is estimated that the desired oxygen concentration will be obtained when the monocrystalline silicon 10 is pulled up under the predetermined conditions. In contrast, the pull-up controller 30B does not set the predetermined conditions as the final pull-up conditions when it is estimated that the desired oxygen concentration will not be obtained when the monocrystalline silicon 10 is pulled up under the predetermined conditions, but determines updated pull-up conditions for achieving the desired oxygen concentration as the final pull-up conditions.

Subsequently, the pull-up controller 30B pulls up the monocrystalline silicon 10 whose straight body has the desired oxygen concentration based on the final set pull-up conditions (Step S17).

For instance, provided that the pull-up conditions A shown in Table 4 are used as the predetermined conditions and the direction of the convection flow 90 is estimated to be clockwise, the oxygen concentration in the straight body can be set to the concentration A by pulling up the monocrystalline silicon 10 under the conditions A. When the direction of the convection flow 90 is estimated to be anticlockwise, the oxygen concentration in the straight body can be achieved to the concentration A by determining pull-up conditions that are different from the pull-up conditions A and configured to achieve the concentration A for the oxygen concentration as the final pull-up conditions and pulling up the monocrystalline silicon 10 under the determined pull-up conditions. For instance, the oxygen concentration in the straight body can be set to the concentration A by adjusting at least one of the flow rate of the inert gas flowing in the chamber 2, the internal pressure of the chamber 2, and the rotation speed of the quartz crucible 3A depending on the pull-up conditions A.

The processes of Steps S1 to S4 and S15 to S17 described above correspond to the method of manufacturing the monocrystalline silicon of the invention. The processes of Steps S1 to S4 correspond to the method of estimating the convection pattern of the silicon melt of the invention. The processes of Steps S1 to S4 and S15 correspond to the method of estimating the oxygen concentration of the monocrystalline silicon of the invention.

It should be noted that the oxygen concentration estimation process in Step S15 and the final setting of the pull-up conditions in Step S16 may be performed by an operator, and/or the pull-up process in Step S17 may be performed through an operation of the operator.

[7] Operations and Effects in Second Exemplary Embodiment

The second exemplary embodiment as described above can provide the following operations and effects in addition to the same operations and effects in the first exemplary embodiment.

The monocrystalline silicon 10 having a desired oxygen concentration is manufactured by controlling the flow rate of the inert gas, the internal pressure of the chamber, or the rotation speed of the quartz crucible based on the estimated oxygen concentration. Accordingly, the monocrystalline silicon 10 having the desired oxygen concentration can be obtained, the variation in the oxygen concentration among ingots of the monocrystalline silicon 10 can be restrained. In addition, the manufacturing efficiency of the monocrystalline silicon 10 can be improved.

[8] Modification(s)

It should be understood that the scope of the invention is not limited by the above exemplary embodiments, but various improvements and design modifications compatible with the invention are possible.

For instance, in addition to the first and second measurement points, one or more measurement points may be measured, and the direction of the convection flow 90 may be estimated based on the measurement results of these three or more points.

As long as the first and second measurement points P1 and P2 are located on the first imaginary line 9C that is orthogonal or not orthogonal to the second imaginary line 9F, both the first and second measurement points P1 and P2 may be located on the right side or the left side with respect to the second imaginary line 9F. For instance, even if the first and second measurement points P1 and P2 are located on the right side with respect to the second imaginary line 9F, since X coordinates of the first and second measurement points P1 and P2 are different in the right-handed XYZ Cartesian coordinate system shown in FIG. 2, it can be estimated that the convection flow 90 is fixed clockwise on the basis of the higher temperature at the first measurement point P1 than that at the second measurement point P2 when the X coordinate of the first measurement point P1 is smaller than that of the second measurement point P2 (i.e. the first measurement point P1 is located on the left side relative to the second measurement point P2) and the convection flow 90 is fixed clockwise.

Although the plane viewed from the second magnetic body 14B (the nearby side of the sheet of FIG. 1) is exemplarily shown as the field-orthogonal cross-section, a plane view from the first magnetic body 14A (the far side of the sheet of FIG. 1 (the positive direction of the Y axis in FIG. 2)) may be defined as the field-orthogonal cross-section for the estimation process of the direction of the convection flow 90.

EXAMPLE(S)

Next, Examples of the invention will be described. It should be noted that the invention is by no means limited to Examples.

Experiment 1: Optimization of Setting Height of Reflectors

Experimental Example 1

Firstly, in the pull-up device as shown in FIG. 1, the reflectors 15A each in a form of a silicon mirror was set such that, with reference to the surface of the silicon melt 9, a height K was 500 mm, an angle θf formed by each reflection surface 15C and the horizontal plane F was 45 degrees, and the first measurement point P1 satisfied a relationship of R1/RC=345/800=0.43. The silicon melt 9 was produced and the temperature of the first measurement point P1 was measured with the radiation thermometer 15B.

In addition, a contact type thermometer (a sheathed thermocouple) in a form of a regular component in the chamber 2 was brought into contact with the first measurement point P1 to obtain the measurement result, which was held as a true value.

Then, a measurement error was obtained based on the following equation (6).

$$\text{Measurement Error} = 1 - (\text{Measurement Value}/\text{True Value}) \quad (6)$$

Experimental Examples 2 to 9

The temperature at the first measurement point P1 was measured to obtain a measurement error under the same conditions as in Experimental Example 1 except that the height K was set at positions shown in Table 5 below.

Evaluation

As shown in Table 5, the measurement error was 0 (judgement: OK) in Experimental Examples 2 to 6 in which the height K was in a range from 600 mm to 5000 mm, whereas the measurement error exceeded 0 (judgement: NG) in Experimental Example 1 in which the height K was less than 600 mm and Experimental Examples 7 to 9 in which the height K exceeded 5000 mm.

It is considered that the measurement error occurred for two reasons below when the height K was less than 600 mm. The first reason is a change in a reflection coefficient of the silicon mirror due to thermal wear. The second reason is that SiO gas generated from the surface of the silicon melt 9 adhering on the silicon mirror and the adhering SiO gas was solidified by cooling to cloud the reflection surface. It is considered that luminance was thus not accurately measured to cause the error.

It is also considered that, when the height K exceeds 5000 mm, since a distance from the surface of the silicon melt to the reflectors 15A in a simulation, ambient light by multiple reflection in the chamber 2 enters the reflectors 15A to cause the measurement error.

From the above, it was confirmed that the temperature of the silicon melt was highly accurately measured and the direction of the convection flow 90 of the silicon melt 9 could e highly accurately estimated on a basis of the measurement result by setting the reflectors 15A at the height K in a range from 600 mm to 5000 mm.

TABLE 5

|  | Setting height H (mm) | Measurement error | Judgement |
|---|---|---|---|
| Experimental Ex. 1 | 500 | 0.07 | NG |
| Experimental Ex. 2 | 600 | 0 | OK |
| Experimental Ex. 3 | 700 | 0 | OK |
| Experimental Ex. 4 | 1000 | 0 | OK |
| Experimental Ex. 5 | 3000 | 0 | OK |
| Experimental Ex. 6 | 5000 | 0 | OK |
| Experimental Ex. 7 | 5100 | 0.07 | NG |
| Experimental Ex. 8 | 5500 | 0.15 | NG |
| Experimental Ex. 9 | 6000 | 0.27 | NG |

Experiment 2: Optimization of First and Second Measurement Points on Surface of Silicon Melt

Experimental Example 10

In the pull-up device in Experiment 1, a pair of reflectors 15A (silicon mirror) were set such that the height K was 3000 mm, the angle θf formed by each reflection surface 15C and the horizontal plane F was 45 degrees, and the first and second measurement points P1, P2 satisfied a relationship of R1/RC=0.1 and a relationship of R2/RC=0.1, respectively.

The, a predetermined amount of silicon melt 9 was produced and the temperatures of the first and second measurement points P1, P2 were measured with the radiation thermometers 15B.

Experimental Examples 11 to 15

Experimental Examples 11 to 15 were conducted to measure the temperatures and obtain a difference between the temperatures under the same conditions as Experimental Example 10 except that the first and second measurement points P1, P2 were set such that R1/RC and R2/RC satisfied the shown in Table 6.

Evaluation

Specifically, if the direction of the convection flow 90 of the silicon melt 9 can be highly accurately estimated when the temperature difference between the first and second measurement points P1 and P2 is 8 degrees C. or more, it can be said that the direction of the convection flow 90, which cannot be highly accurately estimated in Experimental Examples 10 to 12 with the temperature difference of less than 8 degrees C., can be highly accurately estimated in Experimental Examples 13 to 15 with the temperature difference of 8 degrees C. or more.

From the above, it was confirmed that the direction of the convection flow 90 can be highly accurately estimated by measuring the first and second measurement points P1 and P2 that satisfied the above equations (3) and (4).

TABLE 6

|  | R1/RC (R2/RC) | Temperature difference between first and second measurement points (°) | Judgement |
|---|---|---|---|
| Experimental Ex. 10 | 0.1 | 1 | NG |
| Experimental Ex. 11 | 0.2 | 2 | NG |
| Experimental Ex. 12 | 0.3 | 4 | NG |

TABLE 6-continued

| | R1/RC (R2/RC) | Temperature difference between first and second measurement points (°) | Judgement |
|---|---|---|---|
| Experimental Ex. 13 | 0.375 | 8 | OK |
| Experimental Ex. 14 | 0.5 | 12 | OK |
| Experimental Ex. 15 | 0.99 | 15 | OK |

Experiment 3: Optimization of Reflection Angle of Reflection Surface

Experimental Example 16

In the pull-up device in Experiment 1, the reflectors 15A (silicon mirror) were set such that the height K was 3000 mm, the angle θf formed by each reflection surface 15C and the horizontal plane F was 30 degrees, and the first measurement point P1 satisfied a relationship of R1/RC=0.43. A predetermined amount of the silicon melt 9 was produced and the temperature of the first measurement point P1 was measured with the radiation thermometer 15B. Further, a platinum thermocouple was immersed near the first measurement point P1 and a temperature was measured as a true value of the first measurement point.

Then, a measurement error was calculated based on the above equation (6).

Experimental Examples 17 to 26

Experimental Examples 17 to 26 each were conducted under the same conditions as those in Experimental Example 16 except that an attitude of each reflection surface 15C was adjusted such that the angles θf formed by the reflection surface 15C and the horizontal plane F were each at values shown in Table 6 below.

Evaluation

As shown in Table 7, the measurement error was 0 (judgement: OK) in Experimental Examples 19 to 23 in which the angle θf was in a range from 40 degrees to 50 degrees, whereas the measurement error exceeded 0 (judgement: NG) in Experimental Examples 16 to 18 (the angle θf of less than 40 degrees) and Experimental Examples 24 to 26 (the angle θf of more than 50 degrees).

It is considered that, when the angle θf was less than 40 degrees or more than 50 degrees, since the distance from the surface 9A of the silicon melt 9 to each of the reflectors 15A was long, ambient light by multiple reflection in the chamber 2 enters the reflectors 15A to cause the measurement error.

From the above, it was confirmed that the temperature of the silicon melt could be highly accurately measured and the direction of the convection flow 90 of the silicon melt 9 could be highly accurately estimated on a basis of the measurement result by setting the reflectors 15A at the angle θf formed by each reflection surface 15C and the horizontal plane F in a range from 40 degrees to 50 degrees.

TABLE 7

| | Reflection surface angle θ f (°) | Measurement error | Judgement |
|---|---|---|---|
| Experimental Ex. 16 | 30 | 0.1 | NG |
| Experimental Ex. 17 | 35 | 0.05 | NG |

TABLE 7-continued

| | Reflection surface angle θ f (°) | Measurement error | Judgement |
|---|---|---|---|
| Experimental Ex. 18 | 38 | 0.02 | NG |
| Experimental Ex. 19 | 40 | 0 | OK |
| Experimental Ex. 20 | 42 | 0 | OK |
| Experimental Ex. 21 | 45 | 0 | OK |
| Experimental Ex. 22 | 47 | 0 | OK |
| Experimental Ex. 23 | 50 | 0 | OK |
| Experimental Ex. 24 | 52 | 0.02 | NG |
| Experimental Ex. 25 | 55 | 0.05 | NG |
| Experimental Ex. 26 | 60 | 0.1 | NG |

Experiment 4: Relationship Between Convection Flow Direction of Silicon Melt and Oxygen Concentration In the pull-up device as shown in FIG. 1, the reflectors 15A were set such that the height K was 3000 mm, the angle θf formed by each reflection surface 15C and the horizontal plane F was 45 degrees, and the first and second measurement points P1, P2 satisfied a relationship of R1/RC=0.43 and a relationship of R2/RC=0.43, respectively.

Then, after producing a predetermined amount of the silicon melt 9, a horizontal magnetic field was applied to the silicon melt 9 at a timing and monocrystalline silicon was pulled up without estimating the direction of the convection flow 90 flow.

Seven ingots of monocrystalline silicon in total (ingots of monocrystalline silicon in Experimental Examples 27 to 33) were pulled up by the above-described method, and the oxygen concentration of each monocrystalline silicon was obtained by the following method.

Firstly, silicon wafers, which were cut out from a plurality of sections of each monocrystalline silicon, were subjected to a donor killer process. In the donor killer process, each silicon wafer placed on a boat was loaded into a horizontal furnace having a furnace temperature of 650 degrees C. under a 100% nitrogen atmosphere at a rate of 20 mm/min. The silicon wafer was subjected to a thermal treatment for 30 minutes in the horizontal furnace, carried out with the boat at a speed of 20 mm/min., and cooled in the ambient atmosphere.

Next, an oxygen concentration of the silicon wafer after the donor killer process was measured using FTIR (Fourier Transform Infrared Spectrometer) in accordance with ASTM F-121 (1979).

Figure 10:
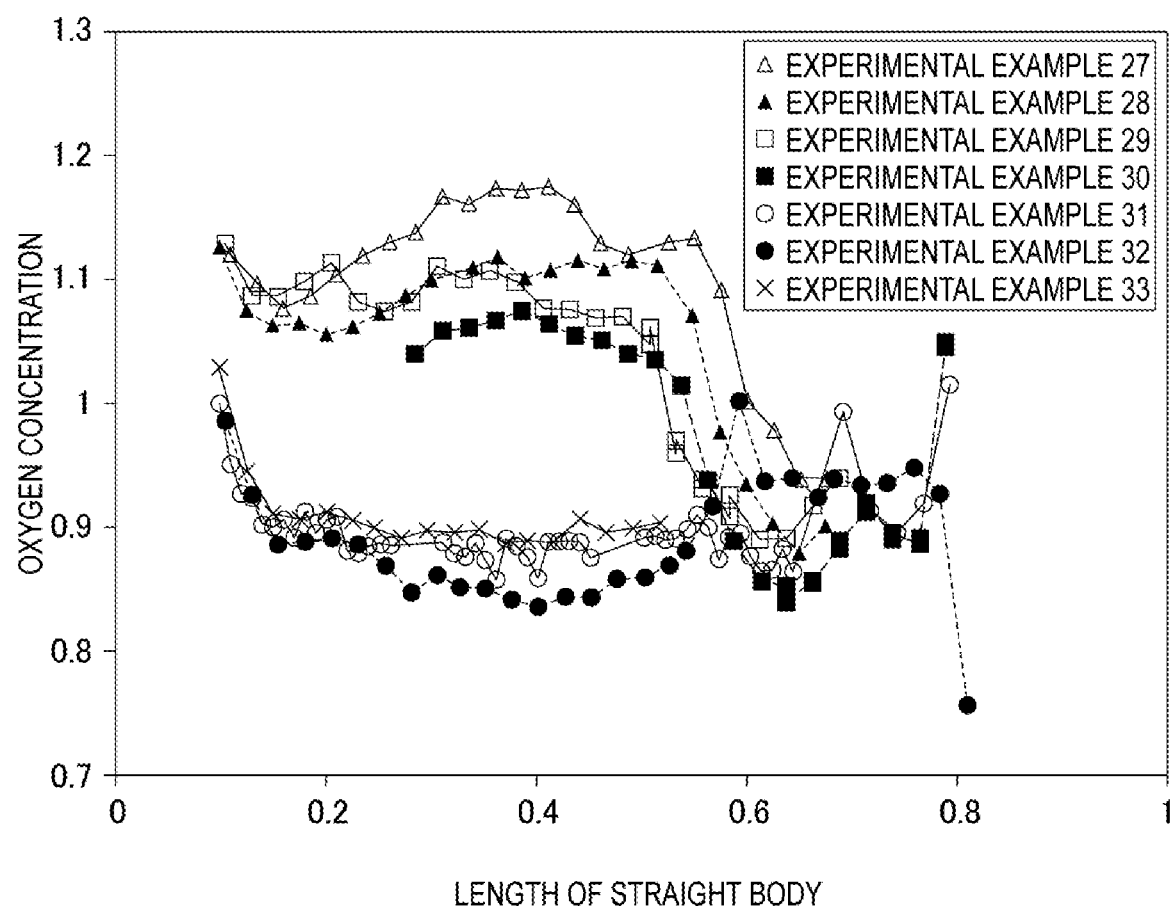
FIG. 10 is a graph showing a relationship between a length of a straight body and an oxygen concentration in monocrystalline silicon in Experiment 4 of Examples in the invention.

FIG. 10 shows an oxygen concentration distribution in a longitudinal direction of each monocrystalline silicon. In FIG. 10, the abscissa axis represents a position with respect to a length of the entire straight body being defined as 1 and the ordinate axis represents an oxygen concentration when a predetermined oxygen concentration is defined as 1.

It was confirmed that the oxygen concentration of substantially the entire straight body was more than 1 (more than the predetermined value) in Experimental Examples 27 to 29 and was less than 1 (less than the predetermined value) in Experimental Examples 30 to 33, as shown in FIG. 10. In other words, it was confirmed that, for instance, when the oxygen concentration in Experimental Examples 27 to 29 was set as a target value, a yield rate of the product was only about 50%.

It is considered that a reason for the generation of the difference in the oxygen concentration is that the direction of the convection flow 90 in the silicon melt 9 at the timing of pulling up the monocrystalline silicon was different between Experimental Examples 27 to 29 and Experimental Examples 30 to 33.

Accordingly, it is considered that monocrystalline silicon having a desired oxygen concentration can be obtained and a variation in the oxygen concentration among monocrystalline silicon ingots can be restrained by estimating the direction of the convection flow 90 of the silicon melt according to the convection pattern estimation method of the invention and applying suitable pull-up conditions based on the estimated direction.

The invention claimed is:

1. A manufacturing method of monocrystalline silicon, comprising:
    determining in advance as predetermined conditions, pull-up conditions for achieving a desired value of an oxygen concentration of the monocrystalline silicon when in a right-handed XYZ Cartesian coordinate system defining a center of a surface of a silicon melt as an origin, a vertically upward direction as a positive direction of a Z axis, and a direction in which a horizontal magnetic field is applied as a positive direction of a Y axis, a direction of a convection flow as viewed in a negative direction of the Y axis is a predetermined direction that is one of a clockwise direction and an anticlockwise direction;
    applying the horizontal magnetic field having an intensity of 0.2 tesla or more to the silicon melt in a rotating quartz crucible;
    before a seed crystal is dipped into the silicon melt applied with the horizontal magnetic field, measuring temperatures at a first measurement point and a second measurement point both positioned on a first imaginary line that passes through the center of the surface and is not in parallel with the central magnetic field line on the horizontal magnetic field as viewed vertically from above;
    estimating the direction of the convection flow in the silicon melt in a plane orthogonal to the direction in which the horizontal magnetic field is applied, on a basis of the measured temperatures at the first measurement point and the second measurement point; and
    pulling up the monocrystalline silicon, wherein
    in the clockwise direction, the convection flow flows in an ascending direction on a left side with respect to the central magnetic field line and flows in a descending direction on a right side with respect to the central magnetic field line,
    in the anticlockwise direction, the convection flow flows in the ascending direction on the right side with respect to the central magnetic field line and flows in the descending direction on the left side with respect to the central magnetic field line,
    the first measurement point and the second measurement point are located across a second imaginary line that passes through the center of the surface and is in parallel with the central magnetic field line of the horizontal magnetic field as viewed vertically from above,
    the first measurement point is located in a negative direction of an X axis with respect to the second measurement point in the XYZ Cartesian coordinate system,
    in the estimating of the direction of the convection flow, the direction of the convection flow is estimated to be fixed in the clockwise direction when the temperature at the first measurement point is higher than the temperature at the second measurement point, and the direction of the convection flow is estimated to be fixed in the anticlockwise direction when the temperature at the first measurement point is lower than the temperature at the second measurement point,
    when the estimated direction of the convection flow is not the predetermined direction, the intensity of the horizontal magnetic field is lowered to less than 0.01 tesla and subsequently increased to 0.2 tesla or more to fix the direction of the convection flow in the predetermined direction, subsequently the temperatures at the first measurement point and the second measurement point are measured and the direction of the convection flow is estimated,
    when the estimated direction of the convection flow is the predetermined direction, the monocrystalline silicon is pulled up on a basis of the predetermined conditions while the intensity of the horizontal magnetic field is kept at 0.2 tesla or more and the direction of the convection is fixed in the predetermined direction.

2. A pull-up device of monocrystalline silicon, comprising:
    a quartz crucible;
    magnetic-field applying portions located across the quartz crucible and configured to apply a horizontal magnetic field to a silicon melt in the quartz crucible;
    a temperature sensor configured to measure temperatures at a first measurement point and a second measurement point both positioned on a first imaginary line that passes through a center of a surface of the silicon melt and is not in parallel with a central magnetic field line on the horizontal magnetic field;
    a convection pattern estimation portion configured to estimate a direction of a convection flow in the silicon melt in a plane orthogonal to a direction in which the horizontal magnetic field is applied, on a basis of the temperatures at the first measurement point and the second measurement point measured by the temperature sensor; and
    a pull-up controller, wherein
    the first measurement point and the second measurement point are located across a second imaginary line that passes through the center of the surface and is in parallel with the central magnetic field line of the horizontal magnetic field,
    the first measurement point is located in a negative direction of an X axis with respect to the second measurement point in a right-handed XYZ Cartesian coordinate system defining the center of the surface of the silicon melt as an origin, a vertically upward direction as a positive direction of a Z axis, and the direction in which the horizontal magnetic field is applied as a positive direction of a Y axis,
    the temperature sensor measures
    the first measurement point satisfying a formula (3):

$$0.375 \leq R1/RC < 1 \tag{3}$$

and the second measurement point satisfying a formula (4):

$$0.375 < R2/RC < 1 \tag{4}$$

provided that a distance from the center of the surface of the silicon melt to the first measurement point is denoted as R1, a distance from the center of the surface of the silicon melt to the second measurement point is denoted as R2, and a radius of an inner diameter of the quartz crucible is denoted as RC, the pull-up controller determines in advance as predetermined conditions, pull-up conditions for achieving a desired value of an oxygen concentration of the monocrystalline silicon when in the XYZ Cartesian coordinate system, the direction of the convection flow as viewed in a negative direction of the Y axis is a predetermined direction that is one of a clockwise direction and an anticlockwise direction, in the clockwise direction, the convection flow flows in an ascending direction on a left side with respect to the central magnetic field line and flows in a descending direction on a right side with respect to the central magnetic field line, in the anticlockwise direction, the convection flow flows in the ascending direction on the right side with respect to the central magnetic field line and flows in the descending direction on the left side with respect to the central magnetic field line, the convection pattern estimation portion estimates the direction of the convection flow to be fixed in the clockwise direction when the temperature at the first measurement point is higher than the temperature at the second measurement point, and estimates the direction of the convection flow to be fixed in the anticlockwise direction when the temperature at the first measurement point is lower than the temperature at the second measurement point, the pull-up controller lowers an intensity of the horizontal magnetic field to less than 0.01 tesla and subsequently increases the intensity of the horizontal magnetic field to 0.2 tesla or more to fix the direction of the convection flow in the predetermined direction, subsequently controls the temperature sensor to measure the temperatures at the first measurement point and the second measurement point, and controls the convection pattern estimation portion to estimate the direction of the convection when the direction of the convection flow estimated by the convection pattern estimation portion is not the predetermined direction, and the pull-up controller pulls up the monocrystalline silicon on a basis of the predetermined conditions while the intensity of the horizontal magnetic field is kept at 0.2 tesla or more and the direction of the convection is fixed in the predetermined direction when the direction of the convection flow is the predetermined direction.

3. The pull-up device of the monocrystalline silicon according to claim 2, wherein
the temperature sensor comprises:
a pair of reflectors provided inside a chamber in which the quartz crucible is provided, and each configured to reflect corresponding one of radiation lights from the first measurement point and the second measurement point; and
a pair of radiation thermometers provided outside the chamber and configured to receive the radiation lights reflected on the respective reflectors and measure temperatures at the first measurement point and the second measurement point.

4. The pull-up device of the monocrystalline silicon according to claim 3, wherein
the pair of reflectors are positioned such that a distance from a lower end of each of the reflectors to the surface of the silicon melt is in a range from 600 mm to 5000 mm.

5. The pull-up device of the monocrystalline silicon according to claim 3, wherein
the pair of reflectors each have a reflection surface, and
the reflection surface is positioned such that an angle of the reflection surface to a horizontal plane is in a range from 40 degrees to 50 degrees.

6. The pull-up device of the monocrystalline silicon according to claim 2, further comprising:
a storage configured to store a relationship between the direction of the convection flow and an oxygen concentration of the monocrystalline silicon; and
an oxygen concentration estimation portion configured to estimate an oxygen concentration in a straight body of the pulled up monocrystalline silicon on a basis of the direction of the convection flow estimated by the convection pattern estimation portion and the relationship stored in the storage, wherein
the pull-up controller adjusts at least one of a flow rate of inert gas flowing in a chamber, an internal pressure of the chamber and a rotation speed of the quartz crucible on a basis of the oxygen concentration estimated by the oxygen concentration estimation portion while the intensity of the horizontal magnetic field is kept at 0.2 tesla or more, and pulls up the monocrystalline silicon.

* * * * *